(12) United States Patent
Cho et al.

(10) Patent No.: US 7,924,650 B2
(45) Date of Patent: Apr. 12, 2011

(54) DYNAMICALLY CONTROLLED VOLTAGE REGULATOR FOR A MEMORY

(75) Inventors: Hoyeol Cho, Palo Alto, CA (US); Heechoul Park, San Jose, CA (US); Jungyong Lee, San Jose, CA (US)

(73) Assignee: Oracle America, Inc., Redwood Shores, CA (US)

( * ) Notice: Subject to any disclaimer, the term of this patent is extended or adjusted under 35 U.S.C. 154(b) by 105 days.

(21) Appl. No.: 12/494,700

(22) Filed: Jun. 30, 2009

(65) Prior Publication Data
US 2010/0329063 A1 Dec. 30, 2010

(51) Int. Cl.
*G11C 5/14* (2006.01)
(52) U.S. Cl. .................... 365/226; 365/154; 365/229
(58) Field of Classification Search .................. None
See application file for complete search history.

(56) References Cited

U.S. PATENT DOCUMENTS 5,901,103 A * 5/1999 Harris et al. ................ 365/226
7,360,006 B2 * 4/2008 Ho et al. ...................... 710/306

OTHER PUBLICATIONS

Cho, Hoyoel et al., U.S. Appl. No. 12/340,529, filed Dec. 19, 2008, entitled "Method and Apparatuses for Improving Reduced Power Operations in Embedded Memory".

* cited by examiner

*Primary Examiner* — Tan T. Nguyen
(74) *Attorney, Agent, or Firm* — Park, Vaughan, Fleming & Dowler LLP

(57) ABSTRACT

A memory device that includes multiple blocks of static random access memory (SRAM), which each have a standby mode and an active operating mode, is described. During the active operating mode, a selection circuit couples a higher voltage from a first power-signal line and a power-supply circuit to a given block of SRAM, and during the standby mode the selection circuit couples a lower voltage from a second power-signal line to the given block of SRAM. Note that a regulator circuit regulates the lower voltage on the second power-signal line by selectively opening or closing a first switch between the first power-signal line and the second power-signal line. Furthermore, a recycling circuit selectively opens a second switch between the first switch and the first power-signal line when the block of SRAM transitions from the active operating mode to the standby mode, thereby transferring charge from the block of SRAM to other blocks of SRAM.

20 Claims, 6 Drawing Sheets

DYNAMICALLY CONTROLLED VOLTAGE REGULATOR FOR A MEMORY

BACKGROUND

1. Field

The present disclosure generally relates to memory devices. More specifically, the present disclosure relates to a circuit that transfers charge between memory devices when transitioning one of the memory devices from an active operating mode to a standby mode.

2. Related Art

Power consumption in memory devices, such as static random access memories (SRAM), is increasing. For example, as critical dimensions decrease in size to 32 or 45 nm, the leakage current in SRAM and its reliability are becoming significant design problems. Additionally, modern microprocessors typically include a large amount of embedded memory (for example, up to 32 MB in a level 3 cache), which increases the leakage current because most of the SRAM cells in this embedded memory spend a significant amount of time in a standby mode.

To reduce the leakage current, voltage control is often used in an SRAM cell during a read cycle (this voltage control is sometimes referred to as 'read assist'). In particular, during a standby mode the SRAM-cell voltage is in a lower voltage domain (VCS_l. Then, during a read cycle the SRAM-cell voltage is transitioned to a higher voltage domain (VCS_h). While read assist reduces the leakage current, it can waste power because during a read cycle the large capacitance associated with an SRAM cell is charged up to VCS_h, which is subsequently dumped into VCS_l during a precharge cycle.

To address this problem, in some SRAM cells a portion of this charge is recycled or transferred into a bit line (for use during the precharge cycle), and the remaining charge is dumped into ground. However, this technique may not be practical for high-performance embedded memory because the bit-line discharge is relatively small in comparison to the total charge. Consequently, most of the charge is dumped into ground, and little or no charge is recycled. This wasted power increases as the number of SRAM cells connected to each bit line increases (such as in high-performance embedded memory) because more charge is needed to increase the SRAM-cell voltage from VCS_l to VCS_h during a read-assist operation. In particular, the charge equals Cmem·(VCS_h−VCS_l, where Cmem is the memory power capacitance, which includes the SRAM-cell power-wire capacitance and the SRAM-cell junction/gate capacitance.

Hence, what is needed are memory devices without the problems described above.

SUMMARY

One embodiment of the present disclosure provides a memory device that includes multiple banks. A given bank includes: a block of static random access memory (SRAM) having a standby mode and an active operating mode; and first and second power-signal lines that are each coupled to the block of SRAM and additional banks in the multiple banks, where the first power-signal line is coupled to a power-supply circuit that provides a first voltage to the multiple banks. Moreover, a regulator circuit regulates a second voltage on the second power-signal line by selectively opening or closing a first switch between the first power-signal line and the second power-signal line. Furthermore, a selection circuit couples the first voltage to the block of SRAM during the active operating mode and the second voltage to the block of SRAM during the standby mode. Additionally, a recycling circuit selectively opens a second switch between the first switch and the first power-signal line when the block of SRAM transitions from the active operating mode to the standby mode, thereby transferring charge from the block of SRAM to the one or more additional blocks of SRAM in the one or more additional banks.

In some embodiments, the regulator circuit provides leakage current to the block of SRAM during the standby mode.

Furthermore, the recycling circuit may include one or more serially coupled delay elements that determine how long the second switch is selectively opened. Alternatively or additionally, the recycling circuit may have a configurable delay that determines how long the second switch is selectively opened.

Note that only a given block of SRAM, which can be one of the block of SRAM or the one or more additional blocks of SRAM, may be in the active operating mode at a given time. Moreover, when the given block of SRAM is in the active operating mode, an associated active-mode enable signal may have a different logical value than active-mode enable signals associated with remaining blocks of SRAM in the block of SRAM and the one or more additional blocks of SRAM. In some embodiments, the recycling circuit includes control logic that gates the selective opening of the second switch based at least on one of active-mode enable signals from the block of SRAM and the one or more additional blocks of SRAM, thereby transferring charge from the given block of SRAM to the remaining blocks of SRAM. For example, the control logic may include an OR gate.

In some embodiments, the memory device includes a third switch, which is coupled to the second power-signal line and ground, and which is configured to selectively couple the second power-signal line to ground when the block of SRAM transitions from the active operating mode to the standby mode.

In some embodiments, the regulator circuit regulates the second voltage without the first switch, i.e., the memory device may not include the first switch.

Another embodiment provides a memory system that includes the memory device.

Another embodiment provides a processor that includes the multiple banks, including the given bank.

Another embodiment provides a method for transferring charge from the block of SRAM to the one or more additional blocks of SRAM.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a memory device, a processor with embedded memory that includes the memory device, a memory system that includes the memory device, and a method for transferring charge are described. This memory includes multiple banks, each of which includes a block of static random access memory (SRAM). Moreover, a given block of SRAM has a standby mode and an active operating mode. During the active operating mode, a selection circuit in the memory device couples a higher voltage from a first power-signal line and a power-supply circuit to the given block of SRAM, and during the standby mode the selection circuit couples a lower voltage from a second power-signal line to the given block of SRAM. Note that a regulator circuit in the memory device regulates the lower voltage on the second power-signal line by selectively opening or closing a first switch between the first power-signal line and the second power-signal line. Furthermore, a recycling circuit in the memory device selectively opens a second switch between the first switch and the first power-signal line when the block of SRAM transitions from the active operating mode to the standby mode, thereby transferring charge from the block of SRAM to other banks. This technique for transferring charge reduces power consumption and/or improves performance of the memory device (such as the signal-to-noise ratio, the write speed and/or the read speed).

Figure 1A:
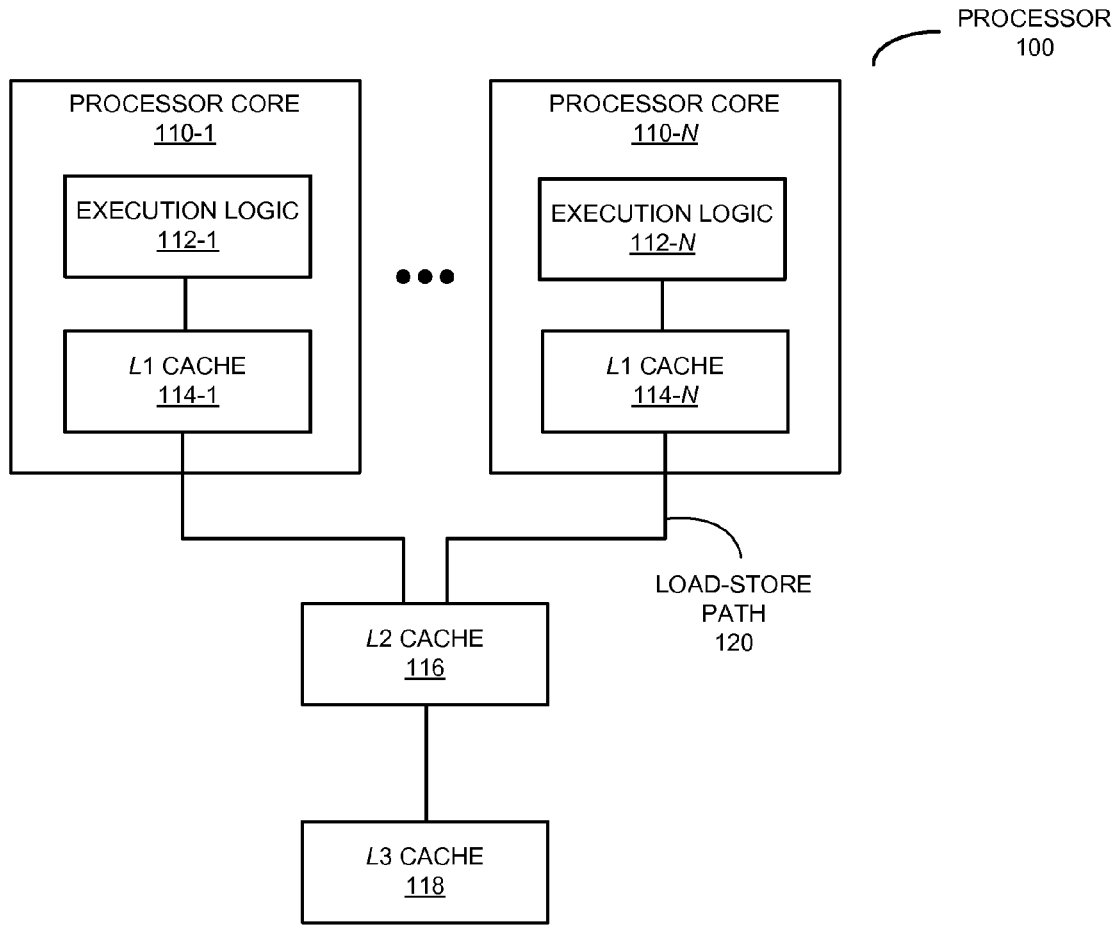
FIG. 1A is a block diagram illustrating a processor in accordance with an embodiment.

We now describe embodiments of the memory device, and the memory system and/or the processor. FIG. 1A presents a block diagram illustrating a processor 100. This processor may include one or more processing cores 110-1 that perform computational operations. Each of these processing cores may include execution logic, such as execution logic 112-1, which is coupled to one or more embedded memory devices or arrays, such as memory devices in a level 1 (L1) cache 114-1, memory devices in a level 2 (L2) cache 116, and/or memory devices in a level 3 (L3) cache 118, via load-store path 120. Note that the embedded memory devices may include multiple banks, each of which includes a block of SRAM. Furthermore, the embedded memory devices may be arranged and accessed hierarchically based on access speed (thus, read and/or write to L1 cache 114-1 may be faster than to L2 cache 116, etc.). While performing the computational operations, processor 100 operates on data items retrieved from the embedded memory devices (or a main memory in a computer system) via load-store path 120

Typically, the cost of processor 100 is determined, at least in part, by its semiconductor area. As a consequence, the embedded memory devices are often fabricated using the minimum available feature size (or critical dimension). However, as noted previously, small-feature size SRAM cells typically have increased leakage current, which increases the standby current (and, thus, the power consumption) of the embedded memory devices and processor 100. As described further below with reference to FIG. 2, the power consumption in processor 100 may be reduced by implementing the charge-transfer technique in the embedded memory devices.

In some embodiments, processor 100 is included in a computer system, such as: a server, a laptop computer, a personal computer, a work station, a mainframe computer, a blade, an enterprise computer, a data center, a portable-computing device, a supercomputer, a network-attached-storage (NAS) system, a storage-area-network (SAN) system, and/or another electronic computing device.

Figure 1B:
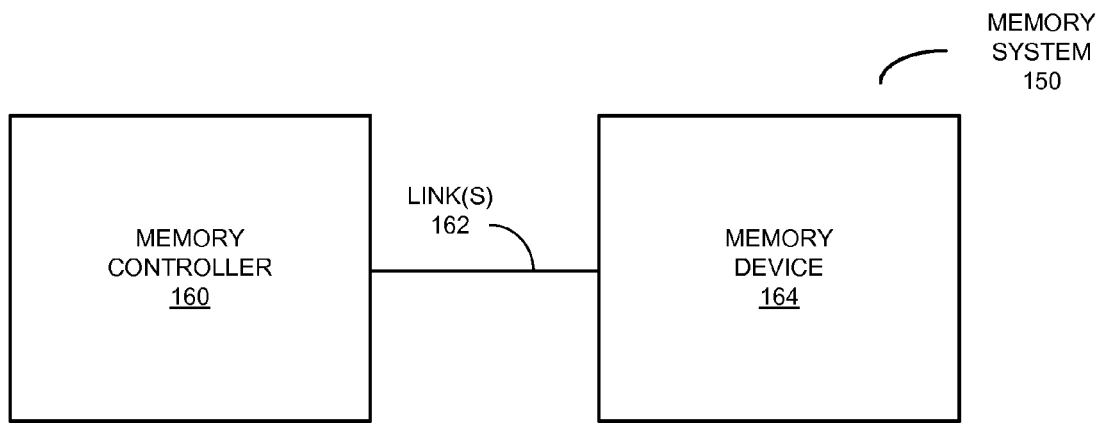
FIG. 1B is a block diagram illustrating a memory system in accordance with an embodiment.

More generally, the memory devices may be included in a memory system, which can be embedded in or external to processor 100. FIG. 1B presents a block diagram illustrating a memory system 150. This memory system includes a memory controller 160 that is coupled, via one or more link(s) 162, to at least one memory device 164 (which may be implemented on a separate substrate, i.e., in a different integrated circuit, than memory controller 160). This memory device includes multiple banks, which, in turn, each include at least one block of SRAM. In some embodiments, memory controller 160 is included in processor 100 (FIG. 1A).

To reduce the cost of memory device 164, the blocks of SRAM may also be implemented using a small feature size or critical dimension, with a commensurate impact on leakage current and power consumption. Consequently, the power consumption in memory device 164 (and, thus, memory system 150) may be reduced by implementing the charge-transfer technique described below in memory device 164.

Figure 2:
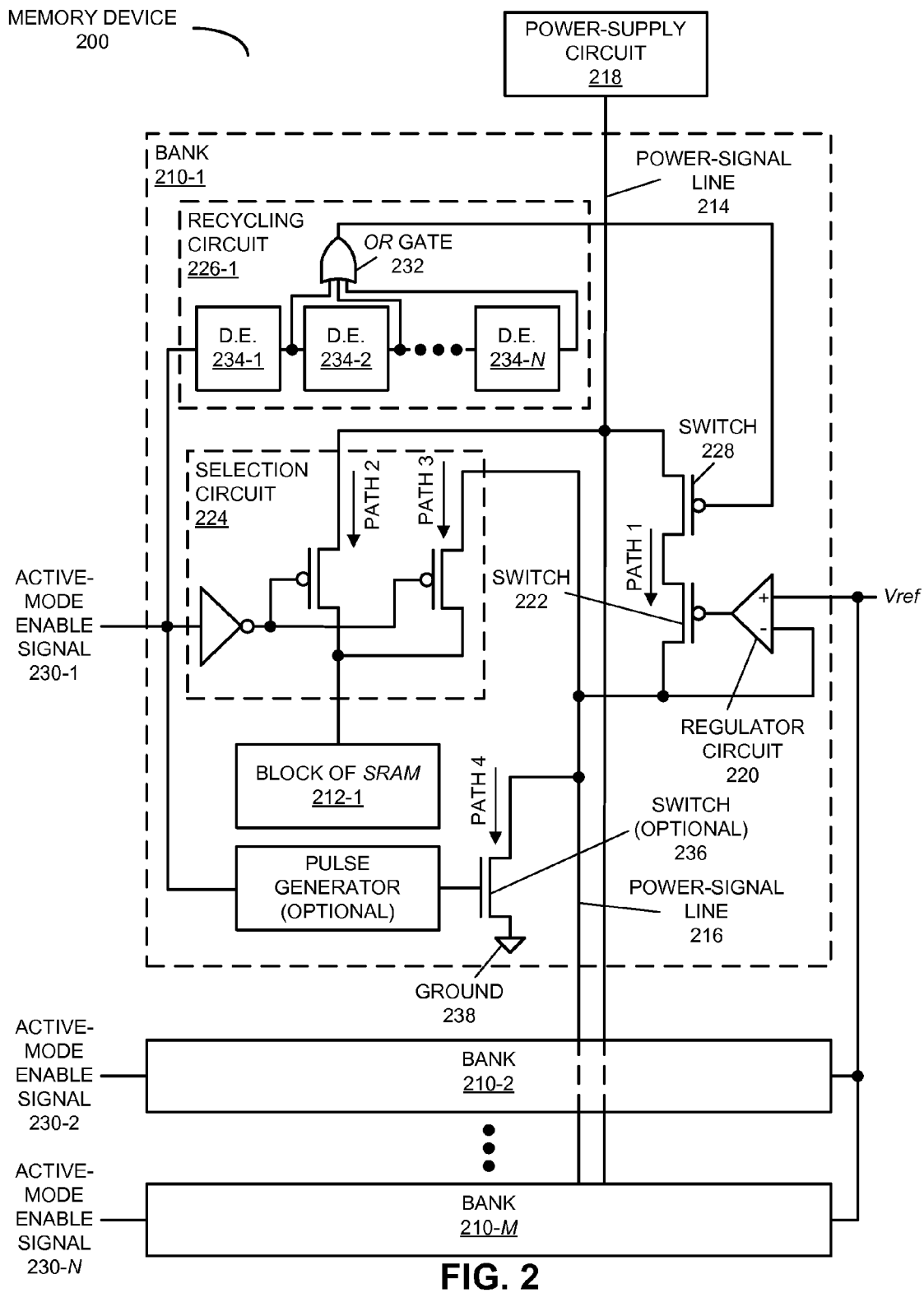
FIG. 2 is a block diagram illustrating a memory device in the processor of FIG. 1A or the memory system of FIG. 1B in accordance with an embodiment.

FIG. 2 presents a block diagram illustrating a memory device 200 in processor 100 (FIG. 1A) or memory system 150 (FIG. 1B). This memory device includes multiple banks 210. A given bank, such as bank 210-1, includes a block of SRAM 212-1 having a standby mode and an active operating mode; a power-signal line 214 and a power-signal line 216 that are each coupled to block of SRAM 212-1 and additional banks in banks 210. In addition, a given bank may include or may be coupled to a power-supply circuit 218 via power-signal line 214. This power-supply circuit provides a higher voltage (VCS_h) to banks 210. Note that power-supply circuit 218 may be internal to or external to memory device 200.

Moreover, a regulator circuit 220 regulates a lower voltage (VCS_l) on power-signal line 216 by selectively opening or closing a p-type metal-oxide-semiconductor (PMOS) switch 222 between power-signal line 214 and power-signal line 216 (path 1 in FIG. 2). In this way, regulator circuit 220 and PMOS switch 222 compensate for the leakage current in block of SRAM 212-1 during the standby mode.

Furthermore, based on active-mode enable signal 230-1 for bank 210-1 (e.g., during a read cycle), a selection circuit 224 selectively couples the higher voltage to block of SRAM 212-1 during the active operating mode (path 2 in FIG. 2) and selectively couples the lower voltage to block of SRAM 212-1 during the standby mode (path 3 in FIG. 2), i.e., the block of SRAM in banks 210 may use read assist. Note that active-mode enable signal 230-1 may be provided by processor 100 (FIG. 1A), memory controller 160 (FIG. 1B) or control logic (not shown) in memory device 200.

Additionally, based on active-mode enable signal 230-1 for bank 210-1, a recycling circuit 226-1 selectively opens a PMOS switch 228 between PMOS switch 222 and power-signal line 214 when block of SRAM 212-1 transitions from the active operating mode to the standby mode, thereby transferring charge from block of SRAM 212-1 to the one or more additional blocks of SRAM in the one or more additional banks in banks 210. This charge-transfer technique recycles charge stored in block of SRAM 212-1 and the associated signals lines during the active operating mode for use during one or more precharge cycles in the one or more additional banks, which reduces the power consumption of memory device 200.

Note that only one of banks 210 (and its associated block of SRAM) may be in the active operating mode at a given time. When a given block of SRAM is in the active operating mode, its associated active-mode enable signal may have a different logical value than active-mode enable signals associated with remaining blocks of SRAM in the one or more additional blocks of SRAM. For example, when block 210-1 is in the active operating mode, active-mode enable signal 230-1 may have a logical 'HI' value while the active-mode enable signals for the remaining banks may have a logical 'LOW' value. Timing signals during operation of memory device 200 are described further below with reference to FIG. 3.

In some embodiments, recycling circuit 226-1 includes control logic that gates the selective opening of PMOS switch 228 based at least on active-mode enable signal 230-1. For example, the control logic may include an OR gate 232. Furthermore, recycling circuit 226-1 may include one or more serially coupled delay elements (D.E.) 234 (such as flip-flops) that determine how long PMOS switch 228 is selectively opened (and, thus, for how many cycles the charge is available for recycling to other banks 210). Alternatively or additionally, delay elements 234 may be configurable to define an adjustable delay that determines how long PMOS switch 228 is selectively opened.

In some embodiments, the memory device includes an optional n-type metal-oxide-semiconductor (NMOS) switch 236 that selectively couples power-signal line 216 to ground 238 (path 4 in FIG. 2) when block of SRAM 212-1 transitions from the active operating mode to the standby mode. For example, active-mode enable signal 230-1 may gate an optional short-pulse generator, which may close optional NMOS switch 236 for a predetermined duration. This may be useful if some of the charge cannot be transferred to the other banks in an allotted amount of time.

Figure 3:
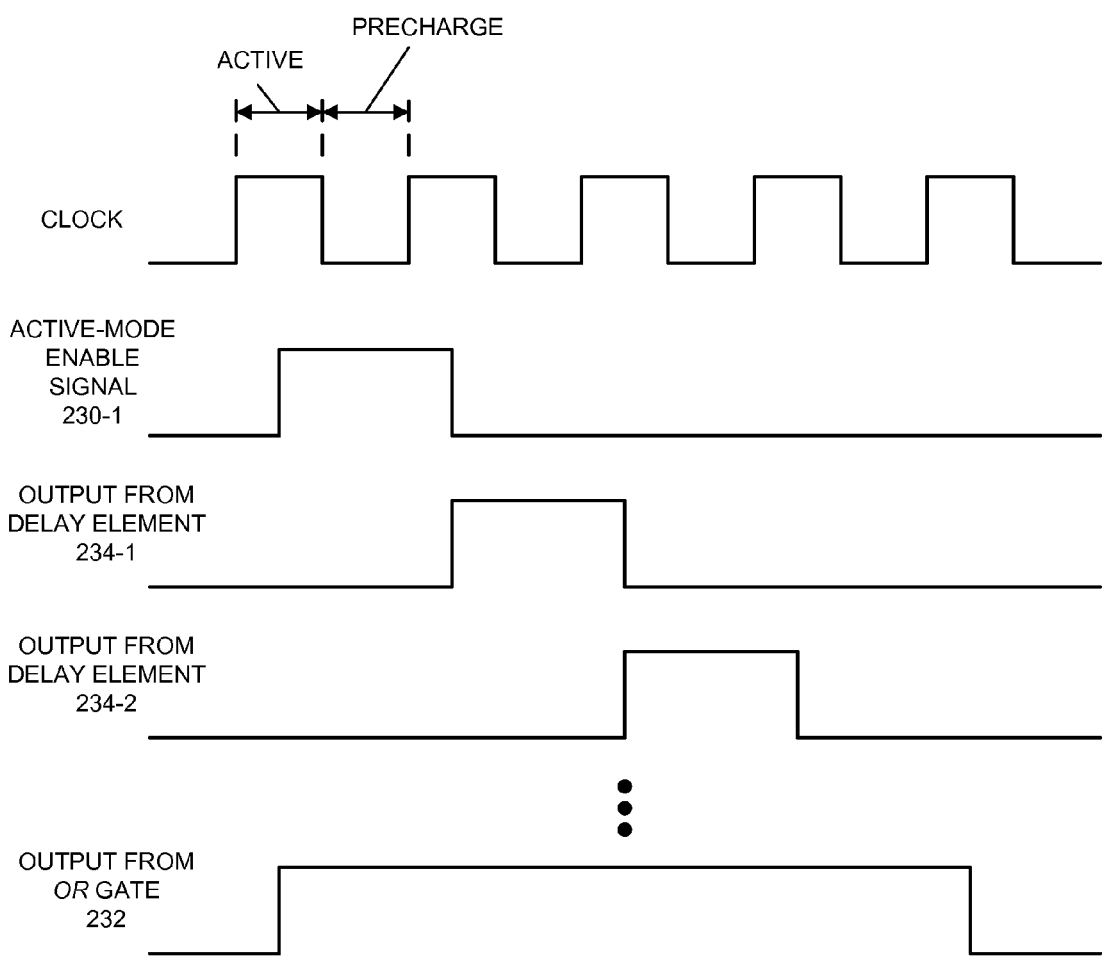
FIG. 3 is a timing diagram illustrating signals in the memory device of FIG. 2 in accordance with an embodiment.

FIG. 3 presents a timing diagram illustrating signals in memory device 200 (FIG. 2). When active-mode enable signal 230-1 is 'HI,' selection circuit 224 (FIG. 2) selectively couples the higher voltage to block of SRAM 212-1 (FIG. 2). Subsequently, active-mode enable signal 230-1 transitions to 'LOW' and an output from a first delay element 234-1 may go 'HI.' When this occurs, selection circuit 224 (FIG. 2) selectively couples the lower voltage to block of SRAM 212-1 (FIG. 2). In addition, the output from OR gate 232 (FIG. 2) in recycling circuit 226-1 (FIG. 2) may transition to 'HI,' which selectively opens PMOS switch 228 (FIG. 2) (normally, this switch is closed). Note that PMOS switch 228 (FIG. 2) may remain open as long as the output from OR gate 232 (FIG. 2) is 'HI,' which is the case as long as one of the outputs from serially coupled delay elements 234 is 'HI.' For example, if there are N delay elements 234, PMOS switch 228 (FIG. 2) may remain open for N cycles of the clock. During this time, if one of the other blocks is in a precharge cycle, charge will be transferred to this block via power-signal line 216 (FIG. 2) from block 210-1 (FIG. 2).

Figure 4:
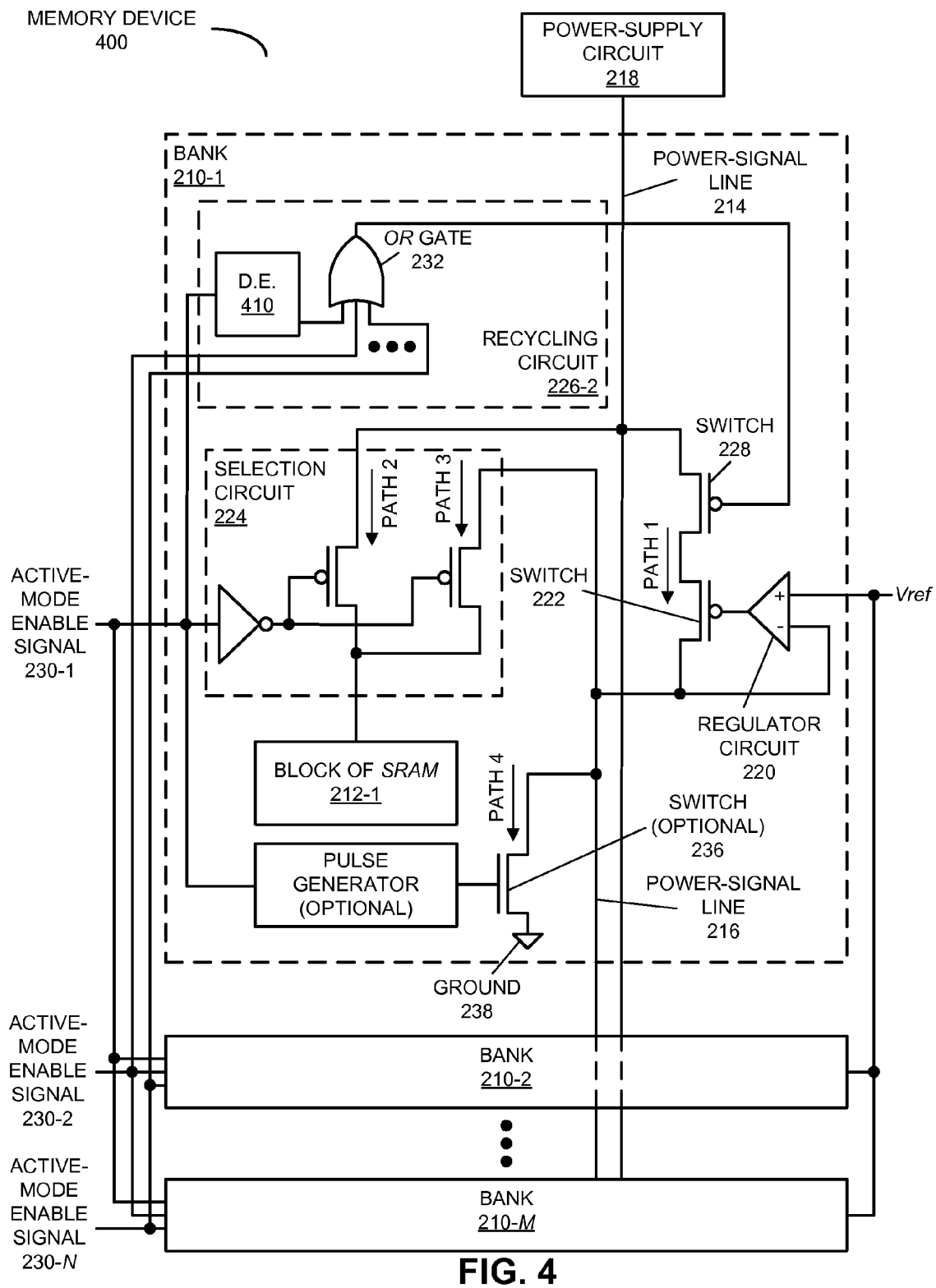
FIG. 4 is a block diagram illustrating a memory device in the processor of FIG. 1A or the memory system of FIG. 1B in accordance with an embodiment.

In some embodiments, PMOS switches, such as PMOS switch 228 (FIG. 2), are selectively opened in multiple (possibly adjacent) banks 210 (FIG. 2) based on active-mode enable signals 230 (FIG. 2). As shown in FIG. 4, which presents a block diagram illustrating a memory device 400 in processor 100 (FIG. 1A) or memory system 150 (FIG. 1B), this may be combined with the charge-transfer technique illustrated in FIG. 2 using delay element 410 (such as one or more flip-flops). Thus, recycling circuit 226-2 may selectively open PMOS switch 228 based at least on active-mode enable signals 230, which allows dynamic control of PMOS switch 228 using active information in the current and/or next clock cycle to control the transfer of charge.

In this way, charge can be recycled as much as possible. Note that the number of PMOS switches selectively opened in banks 210 may depend on the operating frequency and/or the leakage current of the blocks of SRAM. In some embodiments, this information may be stored (for example, using an e-fuse) during a test mode of memory device 400.

Figure 5:
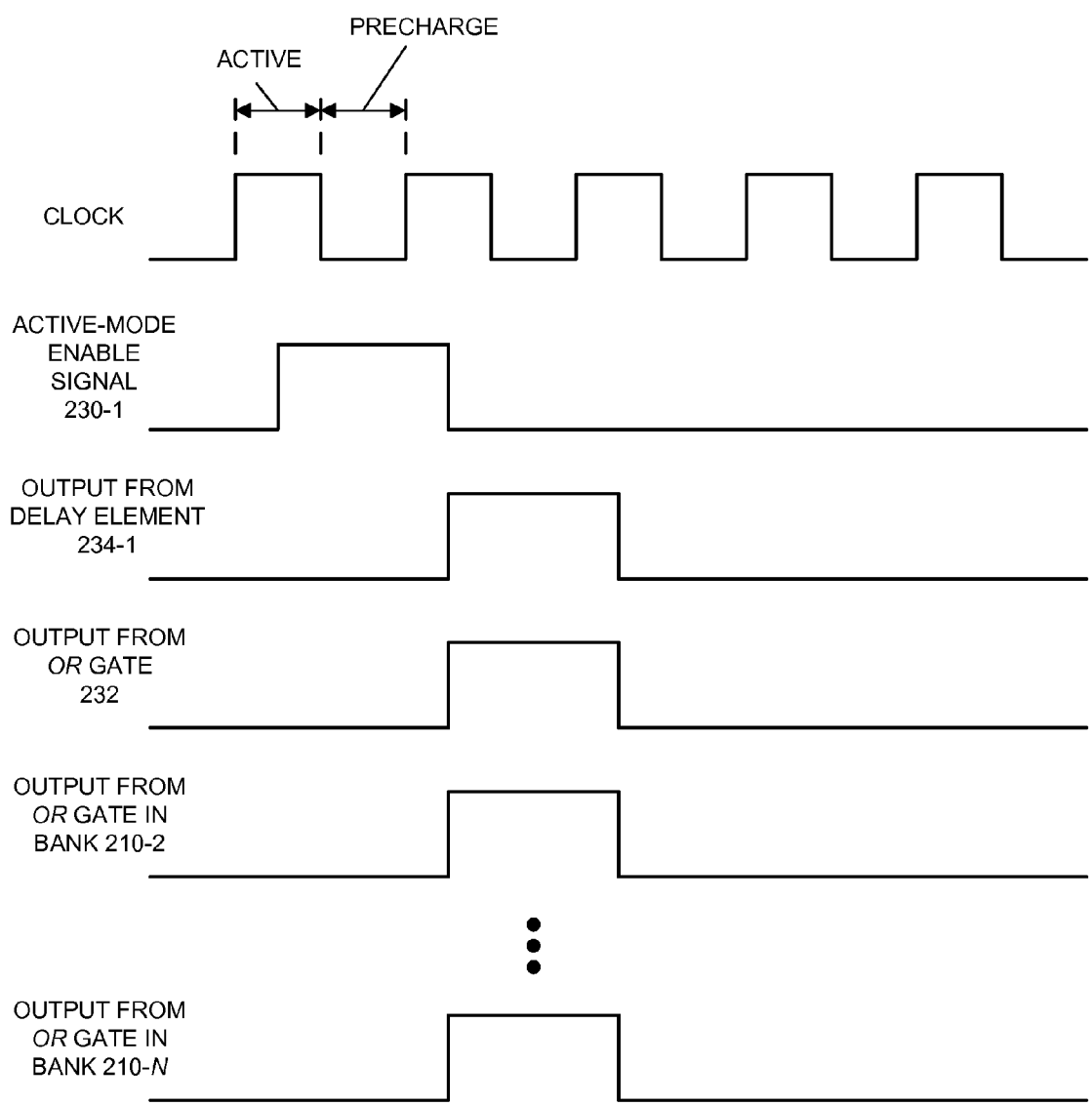
FIG. 5 is a timing diagram illustrating signals in the memory device of FIG. 4 in accordance with an embodiment.

FIG. 5 presents a timing diagram illustrating signals in memory device 400 (FIG. 4). In this example, the output from OR gate 232 in recycling circuit 226-2 (FIG. 4) is 'HI' after active-mode enable signal 230-1 transitions from 'HI' to 'LOW,' i.e., the transition from the active operating mode to the standby mode. In addition, the outputs from OR gates in one or more other banks in banks 210 (FIG. 4) are also 'HI.'

Figure 6:
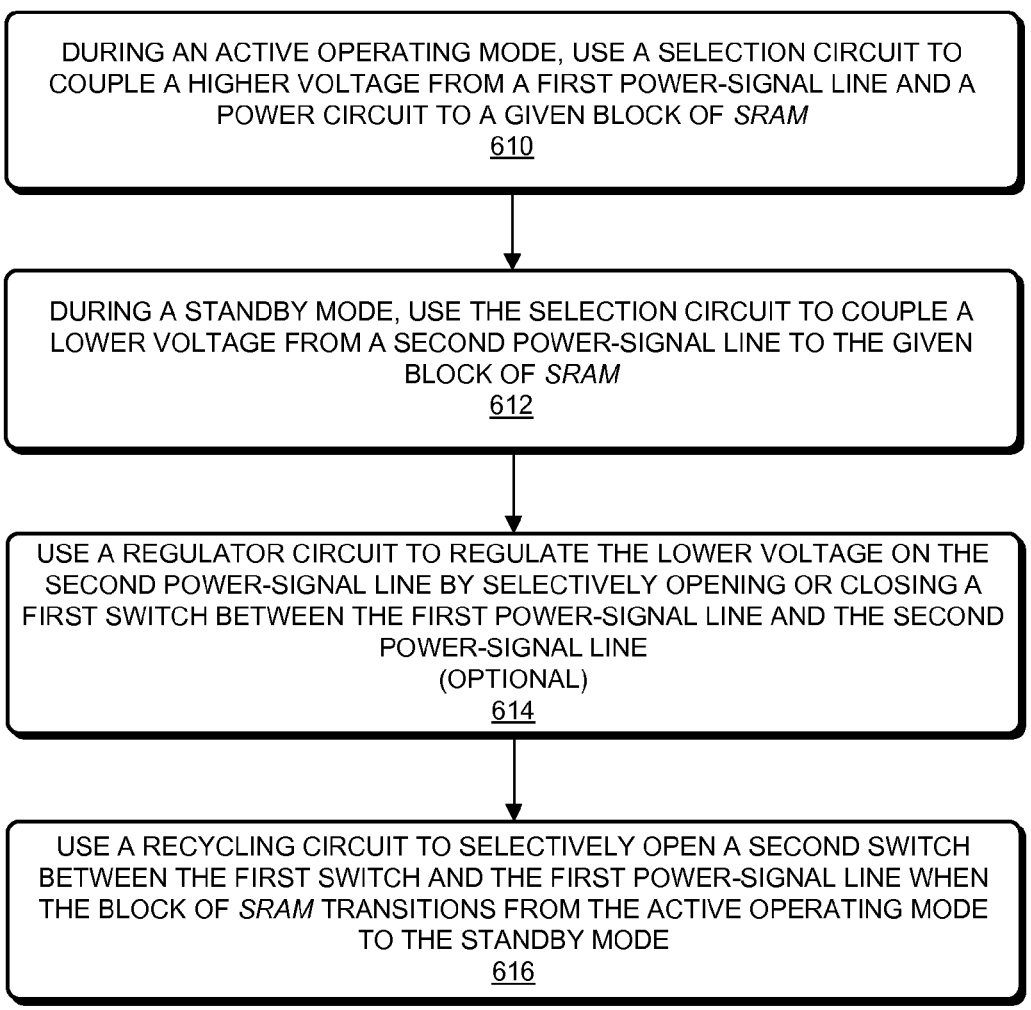
FIG. 6 is a flow diagram illustrating a process for transferring charge from a block of static random access memory (SRAM) to one or more additional blocks of SRAM.

We now describe embodiments of the process. FIG. 6 presents a flow diagram illustrating a process 600 for transferring charge from a block of SRAM to one or more additional blocks of SRAM in a memory device, such as memory device 200 (FIG. 2) or 400 (FIG. 4). During operation, a selection circuit in the memory device couples a higher voltage from a first power-signal line and a power-supply circuit to a given block of SRAM (operation 610). Then, during a standby mode, the selection circuit couples a lower voltage from a second power-signal line to the given block of SRAM (operation 612). Note that a regulator circuit in the memory device may optionally regulate the lower voltage on the second power-signal line by selectively opening or closing a first switch between the first power-signal line and the second power-signal line (operation 614). Furthermore, a recycling circuit in the memory device selectively opens a second switch between the first switch and the first power-signal line when the block of SRAM transitions from the active operating mode to the standby mode (operation 616), thereby transferring charge from the given block of SRAM to the one or more additional blocks of SRAM in other banks in the memory device.

In some embodiments of process 600, there may be additional or fewer operations. Moreover, the order of the operations may be changed and/or two or more operations may be combined into a single operation.

Furthermore, processor 100 (FIG. 1A), memory system 150 (FIG. 1B), memory device 200 (FIG. 2) and/or memory device 400 (FIG. 4) may include fewer components or additional components. Additionally, although these devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed. For example, in the preceding embodiments some components are shown directly connected to one another, while others are shown connected via intermediate components. Each instance of interconnection, or 'coupling,' establishes desired electrical communication between two or more circuit nodes, or terminals. This coupling may often be accomplished using a number of circuit configurations, as will be understood by those of skill in the art.

Note that some or all of the functionality of processor 100 (FIG. 1A), memory system 150 (FIG. 1B), memory device 200 (FIG. 2) and/or memory device 400 (FIG. 4) may be implemented in one or more application-specific integrated circuits (ASICs) and/or one or more digital signal processors (DSPs). Furthermore, functionality in processor 100 (FIG. 1A), memory system 150 (FIG. 1B), memory device 200 (FIG. 2) and/or memory device 400 (FIG. 4) may be implemented more in hardware and less in software, or less in hardware and more in software, as is known in the art. Additionally, the circuits in the preceding embodiments may be implemented using: complementary metal-oxide-semiconductor (CMOS), NMOS, PMOS and/or bipolar-junction transistors.

Designs associated with one or more of the preceding embodiments may be stored on a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIf), Calma GDS II Stream Format (GDSII) or Electronic Design Interchange Format (EDIf). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

While the preceding embodiments have used SRAM as an illustrative example, in other embodiments the charge-transfer technique may be used with other types of memory, such as: volatile memory, non-volatile memory, dynamic random access memory (DRAM), read-only memory (ROM), erasable programmable read-only memory (EPROM), electrically erasable programmable read-only memory (EEPROM), flash, solid-state memory, and/or another type of memory.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A memory device, comprising multiple banks, wherein a given bank includes:
   a block of static random access memory (SRAM) having a standby mode and an active operating mode;
   a first power-signal line and a second power-signal line that are each coupled to the block of SRAM and are each coupled to one or more additional banks in the multiple banks, wherein the first power-signal line is configured to couple to a power-supply circuit, which is configured to provide a first voltage to the multiple banks;
   a regulator circuit configured to regulate a second voltage on the second power-signal line by selectively opening or closing a first switch between the first power-signal line and the second power-signal line;
   a selection circuit configured to couple the first voltage to the block of SRAM during the active operating mode and the second voltage to the block of SRAM during the standby mode; and
   a recycling circuit configured to selectively open a second switch between the first switch and the first power-signal line when the block of SRAM transitions from the active operating mode to the standby mode, thereby transferring charge from the block of SRAM to the one or more additional blocks of SRAM in the one or more additional banks.

2. The memory device of claim 1, wherein the regulator circuit is configured to provide leakage current to the block of SRAM during the standby mode.

3. The memory device of claim 1, wherein the recycling circuit includes one or more serially coupled delay elements that determine how long the second switch is selectively opened.

4. The memory device of claim 1, wherein the recycling circuit has a configurable delay that determines how long the second switch is selectively opened.

5. The memory device of claim 1, wherein only a given block of SRAM, which is one of the block of SRAM and the one or more additional blocks of SRAM, is in the active operating mode at a given time; and
   wherein, when the given block of SRAM is in the active operating mode, an associated active-mode enable signal has a different logical value than active-mode enable signals associated with remaining blocks of SRAM in the block of SRAM and the one or more additional blocks of SRAM.

6. The memory device of claim 5, wherein the recycling circuit includes control logic that gates the selective opening of the second switch based at least on one of active-mode enable signals from the block of SRAM and the one or more additional blocks of SRAM, thereby transferring charge from the given block of SRAM to the remaining blocks of SRAM.

7. The memory device of claim 6, wherein the control logic includes an OR gate.

8. The memory device of claim 1, further comprising a third switch coupled to the second power-signal line and ground which is configured to selectively couple the second power-signal line to ground when the block of SRAM transitions from the active operating mode to the standby mode.

9. A memory system, comprising:
   a memory controller;
   at least one memory device coupled to the memory controller;
   wherein the at least one memory device includes multiple banks, wherein a given bank includes:
      a block of static random access memory (SRAM) having a standby mode and an active operating mode;
      a first power-signal line and a second power-signal line that are each coupled to the block of SRAM and are each coupled to one or more additional banks in the multiple banks, wherein the first power-signal line is configured to couple to a power-supply circuit, which is configured to provide a first voltage to the multiple banks;
      a regulator circuit configured to regulate a second voltage on the second power-signal line by selectively opening or closing a first switch between the first power-signal line and the second power-signal line;
      a selection circuit configured to couple the first voltage to the block of SRAM during the active operating mode and the second voltage to the block of SRAM during the standby mode; and
      a recycling circuit configured to selectively open a second switch between the first switch and the first power-signal line when the block of SRAM transitions from the active operating mode to the standby mode, thereby transferring charge from the block of SRAM to the one or more additional blocks of SRAM in the one or more additional banks.

10. The memory system of claim 9, wherein the recycling circuit includes one or more serially coupled delay elements that determine how long the second switch is selectively opened.

11. The memory system of claim 9, wherein the recycling circuit has a configurable delay that determines how long the second switch is selectively opened.

12. The memory system of claim 9, wherein only a given block of SRAM, which is one of the block of SRAM and the one or more additional blocks of SRAM, is in the active operating mode at a given time; and
wherein, when the given block of SRAM is in the active operating mode, an associated active-mode enable signal has a different logical value than active-mode enable signals associated with remaining blocks of SRAM in the block of SRAM and the one or more additional blocks of SRAM.

13. The memory system of claim 12, wherein the recycling circuit includes control logic that gates the selective opening of the second switch based at least on one of active-mode enable signals from the block of SRAM and the one or more additional blocks of SRAM, thereby transferring charge from the given block of SRAM to the remaining blocks of SRAM.

14. The memory system of claim 9, further comprising a third switch coupled to the second power-signal line and ground which is configured to selectively couple the second power-signal line to ground when the block of SRAM transitions from the active operating mode to the standby mode.

15. A computer system, comprising:
a processor;
at least one memory device coupled to the processor;
wherein the at least on memory device includes multiple banks, wherein a given bank includes:
a block of static random access memory (SRAM) having a standby mode and an active operating mode;
a first power-signal line and a second power-signal line that are each coupled to the block of SRAM and are each coupled to one or more additional banks in the multiple banks;
a power-supply circuit coupled to the first power-signal line, wherein the power-supply circuit is configured to provide a first voltage to the multiple banks;
a regulator circuit configured to regulate a second voltage on the second power-signal line by selectively opening or closing a first switch between the first power-signal line and the second power-signal line;
a selection circuit configured to couple the first voltage to the block of SRAM during the active operating mode and the second voltage to the block of SRAM during the standby mode; and
a recycling circuit configured to selectively open a second switch between the first switch and the first power-signal line when the block of SRAM transitions from the active operating mode to the standby mode, thereby transferring charge from the block of SRAM to the one or more additional blocks of SRAM in the one or more additional banks.

16. The computer system of claim 15, wherein the recycling circuit includes one or more serially coupled delay elements that determine how long the second switch is selectively opened.

17. The computer system of claim 15, wherein the recycling circuit has a configurable delay that determines how long the second switch is selectively opened.

18. The computer system of claim 15, wherein only a given block of SRAM, which is one of the block of SRAM and the one or more additional blocks of SRAM, is in the active operating mode at a given time; and
wherein, when the given block of SRAM is in the active operating mode, an associated active-mode enable signal has a different logical value than active-mode enable signals associated with remaining blocks of SRAM in the block of SRAM and the one or more additional blocks of SRAM.

19. The computer system of claim 18, wherein the recycling circuit includes control logic that gates the selective opening of the second switch based at least on one of active-mode enable signals from the block of SRAM and the one or more additional blocks of SRAM, thereby transferring charge from the given block of SRAM to the remaining blocks of SRAM.

20. The computer of claim 15, further comprising a third switch coupled to the second power-signal line and ground which is configured to selectively couple the second power-signal line to ground when the block of SRAM transitions from the active operating mode to the standby mode.

* * * * *